US008278934B2

(12) United States Patent
Wang

(10) Patent No.: US 8,278,934 B2
(45) Date of Patent: Oct. 2, 2012

(54) ROBUST AC CHASSIS FAULT DETECTION USING PWM SIDEBAND HARMONICS

(75) Inventor: Michael Kon-King Wang, Canton, MI (US)

(73) Assignee: BAE Systems Controls Inc., Johnson City, NY (US)

( * ) Notice: Subject to any disclaimer, the term of this patent is extended or adjusted under 35 U.S.C. 154(b) by 730 days.

(21) Appl. No.: 12/371,241

(22) Filed: Feb. 13, 2009

(65) Prior Publication Data
US 2010/0207634 A1 Aug. 19, 2010

(51) Int. Cl.
*G01R 31/14* (2006.01)
*G01R 31/08* (2006.01)
(52) U.S. Cl. ........................... 324/509; 324/522
(58) Field of Classification Search .................. 324/503, 324/509, 510, 511
See application file for complete search history.

(56) References Cited

U.S. PATENT DOCUMENTS

| | | | |
|---|---|---|---|
| 4,646,011 A * | 2/1987 | Wallrafen | 324/207.25 |
| 5,481,194 A | 1/1996 | Schantz et al. | |
| 5,506,484 A | 4/1996 | Munro et al. | |
| 5,610,452 A * | 3/1997 | Shimer et al. | 307/89 |
| 5,739,698 A * | 4/1998 | Bowers et al. | 324/765.01 |
| 5,831,409 A | 11/1998 | Lindberg et al. | |
| 5,835,322 A | 11/1998 | Smith et al. | |
| 6,856,137 B2 | 2/2005 | Roden et al. | |
| 7,193,827 B2 * | 3/2007 | Reid et al. | 361/42 |
| 7,253,634 B1 * | 8/2007 | Kasztenny et al. | 324/510 |
| 7,295,016 B2 * | 11/2007 | Kishibata et al. | 324/522 |
| 2003/0014200 A1 | 1/2003 | Jonker et al. | |
| 2004/0257271 A1 * | 12/2004 | Jacobson et al. | 342/175 |

OTHER PUBLICATIONS

European Search Report dated Jun. 18, 2010.
Wang J. et al., "Auxiliary Power Supply for Hybrid Electric Vehicles", *Power Electronics Specialists Conference, IEEE, IEEE, Piscataway, NJ, USA* pp. 1502-1507 (2007), XP031218506.
Zhang Q. et al., "A Precise and Adaptive Algorithm for Interharmonics Measurement Based on Iterative DFT", *IEEE Transactions on Power Delivery* 23(4):1728-1735 (2008), XP011225902.
Pressman, A., "Switching Power Supply Design" 1998, 2nd Edition, McGraw-Hill.

* cited by examiner

*Primary Examiner* — Roberto Velez
(74) *Attorney, Agent, or Firm* — Scully, Scott, Murphy & Presser, P.C.; Paul J. Esatto, Jr.

(57) ABSTRACT

A method, apparatus and computer program for detecting an AC chassis fault on one or more DC/AC converters having a load is disclosed, including receiving a chassis voltage $V_{Chassis}$ signal from between DC link and a chassis ground from the DC/AC converter, capturing a side band harmonic of the chassis voltage $V_{Chassis}$ signal, determining a peak magnitude value related to the side band harmonic, comparing the peak magnitude value to a predetermined threshold value, wherein if said peak magnitude value equals or exceeds the predetermined threshold value, an AC chassis fault condition is detected.

15 Claims, 6 Drawing Sheets

ROBUST AC CHASSIS FAULT DETECTION USING PWM SIDEBAND HARMONICS

BACKGROUND OF THE INVENTION

1. Field of the Invention

The present invention generally relates to ground fault protection, and more particularly to an AC ground fault sensor system for detecting ground fault conditions.

2. Description of the Prior Art

The high voltage requirements of traction batteries used to power either electric vehicles or hybrid electric vehicles (HEV) raise significant electrical safety concerns. Chief among these safety concerns are ground fault conditions. A ground fault is an unwanted electric current flow outside of the intended electric circuit flow which can cause significant damage to electronic components within a system (such as an HEV propulsion system), thereby disabling or even destroying the electronic equipment.

Therefore to reduce the likelihood of a shock many conventional traction battery systems employed by electric vehicle or HEV do not have one terminal grounded to the automobile chassis, unlike the typical low voltage automotive storage batteries employed by internal combustion engine vehicles.

FIG. 1 depicts a schematic illustration a conventional power stage 100 of a DC/AC converter, the power stage 100 includes a first power conductor (positive rail) for providing a positive DC link 110 (hereafter "+DC link") and a second power conductor (negative rail) for providing a negative DC link 120 (–DC link"). A power source such as a string of batteries (not shown) is typically coupled to a positive terminal 112 of the +DC link 110 and a negative terminal 122 of the –DC link 120 for providing a high voltage (e.g. 600 volts) power source to drive an electric traction motor (not shown). A conventional balance circuit 130 and a switching mechanism 140, as more fully described below are also provided in the conventional power stage 100. Moreover, DC bus capacitor C3 is coupled to the +DC link 110 and the –DC link 120 for providing stabilization for maintaining the voltage difference (DC Link) between the +DC link 110 and –DC link 120.

As mentioned above, the conventional power stage 100 of a DC/AC converter includes a switching mechanism 140 couple between the +DC link 110 and –DC link 120 including three pairs of switches $sw_1$: $Q_1D_1$: $Q_2D_2$, $sw_2$: $Q_3D_3$: $Q_4D_4$, and $sw_3$ $Q_5D_5$: $Q_6D_6$. Each switching pair includes two NPN transistors and two diodes coupled to common terminal A, B and C respectively. For example, in switch number one $sw_1$, NPN transistor $Q_1$ collector is couple to first power conductor 110 and $Q_1$ emitter is coupled to the anode of first diode $D_1$ and the cathode of second diode $D_2$ and common terminal A. Second NPN transistor $Q_2$ emitter is coupled to the second power conductor 120 and $Q_2$ collector is coupled to $Q_1$ emitter as well as $D_1$, $D_2$ and common terminal A. Common terminals A, B and C are respectively coupled to each phase lead of a multi-phase motor (not shown). Moreover, the switches, $sw_1$, $sw_2$, and $sw_3$ open and close according to a predetermined switching rate to selectively couple power to a given phase through either the positive or negative power conductor links. The switches can be pulse width modulated (PWM) to drive various motor phases and create an AC waveform as known to those skilled in the art. Moreover, the switches may for example take the form of a variety of semiconductor switching devices including field-effect transistors FETs, insulated-gate bipolar transistors IGBTs, bipolar transistors, and silicon controlled rectifiers SCRs as known to those skilled in the art.

In addition to the switching mechanism 140, the conventional power stage 100 of a DC/AC converter includes a conventional balancing circuit 130 which includes a first balance resistor $R_1$ connected to the first power conductor 110 and in series with a second balance resistor $R_2$ where $R_2$ is coupled to the second power conductor 120. Disposed between $R_1$ and $R_2$ is node $N_2$ which is also coupled to a ground (hereafter "vehicle chassis ground" 132). By providing first and second balance resistors $R_1$ and $R_2$, the conventional power stage 100 of a DC/AC converter attempts to provide equally apportioned voltage potentials at the vehicle chassis 132 with respect to +DC link 110 and –DC link 120. In other words, voltage potential at the voltage chassis ground 132 with respect to the –DC link 120 and from +DC link 110 with respect to the vehicle chassis ground 132 are both equal to half of the DC link voltage $V_{dc}$. However, it should be noted that power electronics system utilizes switching technology to synthesize waveforms, such as by means of switching mechanism 140 result in swings in the voltage potential from vehicle chassis ground 132 to –DC link 120 due to the coupled leakage capacitance through phase output leads from a electric traction motor. This vehicle chassis voltage swing can generate noise in a low voltage control system, which ultimately can cause system failures.

To alleviate vehicle chassis voltage swing, conventional balancing circuit 130 includes snubber capacitors, $C_1$ and $C_2$ coupled to node $N_1$, node $N_2$ and vehicle chassis ground 132. The snubber capacitors, $C_1$ and $C_2$ attempt to bypass vehicle chassis voltage swing to achieve stable vehicle chassis voltage. In essence, snubber capacitors, $C_1$ and $C_2$ are provided to reduce or eliminate the AC chassis voltage that appears between vehicle chassis ground 132 and either DC link 110 or DC link 120. For example, if you run a conventional DC/AC converter without grounded snubber capacitors, $C_1$ and $C_2$, the parasitic capacitance from the three phases (A, B, and C) of an electric traction motor (e.g. from the motor windings and cables) would be the lowest impedance in the system resulting in the average A, B, and C phases being imposed between vehicle chassis ground 132 and either +DC link 110 or the –DC link 120. Therefore, conventional balancing circuit 130 attempts to provide an isolating system which minimizes the likelihood of a significant electric shock to electronic equipment in the event of a short circuit or low impedance connection between a phase lead of a motor and the vehicle chassis ground (e.g. a ground fault).

As shown in FIG. 1, snubber capacitors, $C_1$ and $C_2$ are connected via node $N_1$ which is also coupled to node $N_2$. During normal operating conditions, the snubber capacitors and the leakage capacitance provide a path for current to flow at multiple switching frequencies of a power electronics device. Hence, the magnitude of this current is limited by the leakage capacitance. However, as discussed above, when the phase winding is shorted to the vehicle chassis ground 132, a high magnitude fault current is generated which can cause damage to products and equipment. Accordingly, to avoid damage to products and equipment (e.g. the DC/AC converter itself or other products and equipment coupled to the DC/AC converter) snubber capacitors $C_1$ and $C_2$ are typically high capacitance capacitors, which can attempt to continuously sustain a high magnitude of fault current. However, once the magnitude of the fault current exceeds the protective capability of snubber capacitors $C_1$ and $C_2$ products and equipment are susceptible to damage.

Hence, it would be desirable to provide an AC chassis fault detection system, which would indicate a ground fault to protect products and equipment before snubber capacitors $C_1$ and $C_2$ fail to protect the system. Moreover, it would be desirable to have an AC chassis fault detection system, which would be robust in that the detection system could determine if a short exists due to a wide-range of fault conditions. That is, it would be desirable to have an AC fault detection system which could detect an AC fault regardless of the type of electric traction motor attached to an DC/AC converter or the length of the cables connecting each phase (A, B, or C) of the electric traction motor.

BRIEF SUMMARY OF THE INVENTION

The present invention describes an AC chassis fault detector, which determines if a short exists due to a wide-range of fault conditions (e.g. wide-range values of short-circuit impedance).

Specifically the present invention provides a method for detecting an AC chassis fault on one or more DC/AC converters having a load is disclosed, including receiving a chassis voltage $V_{Chassis}$ signal, capturing at least one side band harmonic of the chassis voltage $V_{Chassis}$ signal, determining a peak magnitude value related to the side band harmonic, comparing the peak magnitude value to a predetermined threshold value, wherein if the peak magnitude value equals or exceeds the predetermined threshold value, an AC chassis fault condition is detected.

The peak magnitude is the maximum energy generated by the SBH minus the maximum energy generated by one or more DC/AC converters on a load operating under normal operating conditions without a fault over a predetermined amount of time.

The method can further include coupling one or more filters to the DC link voltage and chassis ground.

In addition, the step of determining a peak value includes a further step of calculating a fault condition value based upon a theoretical side band per unit value, a measured DC voltage $V_{dc}$ of the one or more DC/AC converters, a safety factor value and measured change in time $\Delta t$.

The peak magnitude value and a list of predetermined threshold values are stored.

In the above calculating step, the calculation further comprises, a frequency domain approach to compute a value of a sum of a harmonic voltage squared minus a threshold voltage squared multiplied by a change in time $\Sigma(V_{Har}^2 - V_{Threshold}^2) * \Delta t$, wherein $\Delta t$ is the loop scan time of detection.

The present invention may also include a step of applying said calculated fault condition value to an anti-windup limiter wherein the anti-windup limiter is set to zero.

The calculated fault condition value is compared to a desired threshold value to determine which among a plurality of switches coupled to the one or more DC/AC converters has an AC chassis fault condition, wherein each plurality of switches has a different switching frequency.

The invention may further include an AC chassis fault detector for detecting an AC chassis fault on one or more DC/AC converters having a load.

Specifically, the apparatus includes means for receiving a chassis voltage $V_{Chassis}$ signal, means for capturing at least one side band harmonic of the chassis voltage $V_{Chassis}$ signal, means for determining a peak magnitude value related to the side band harmonic, comparing the peak magnitude value to a predetermined threshold value, wherein if said peak magnitude value equals or exceeds the predetermined threshold value an AC chassis fault condition is detected. A fault condition value is calculated and compared to a desired threshold value to determine which among the DC/AC converters has an AC chassis fault condition.

A corresponding method, program storage device, and computer program product may also be provided.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE INVENTION

Hereinafter, embodiments of the present invention will be described in detail with reference to the accompanying drawings. For the purposes of clarity and simplicity, a detailed description of known functions and configurations incorporated herein will be omitted as it may make the subject matter of the present invention unclear.

The present invention provides an apparatus, system, means, method and computer program for AC chassis fault detection, which employs a frequency domain approach to identify system invariants among a wide variety of fault conditions. System invariants are identified as the pulse width modulation (PWM) sideband harmonics generated by the switching behavior inherent in power electronic devices. Among the identified system invariants are a wide-range values of short-circuit impedance. Some examples of the wide-range of fault conditions are a defective switch, motor windings, cable or the like.

Figure 1:
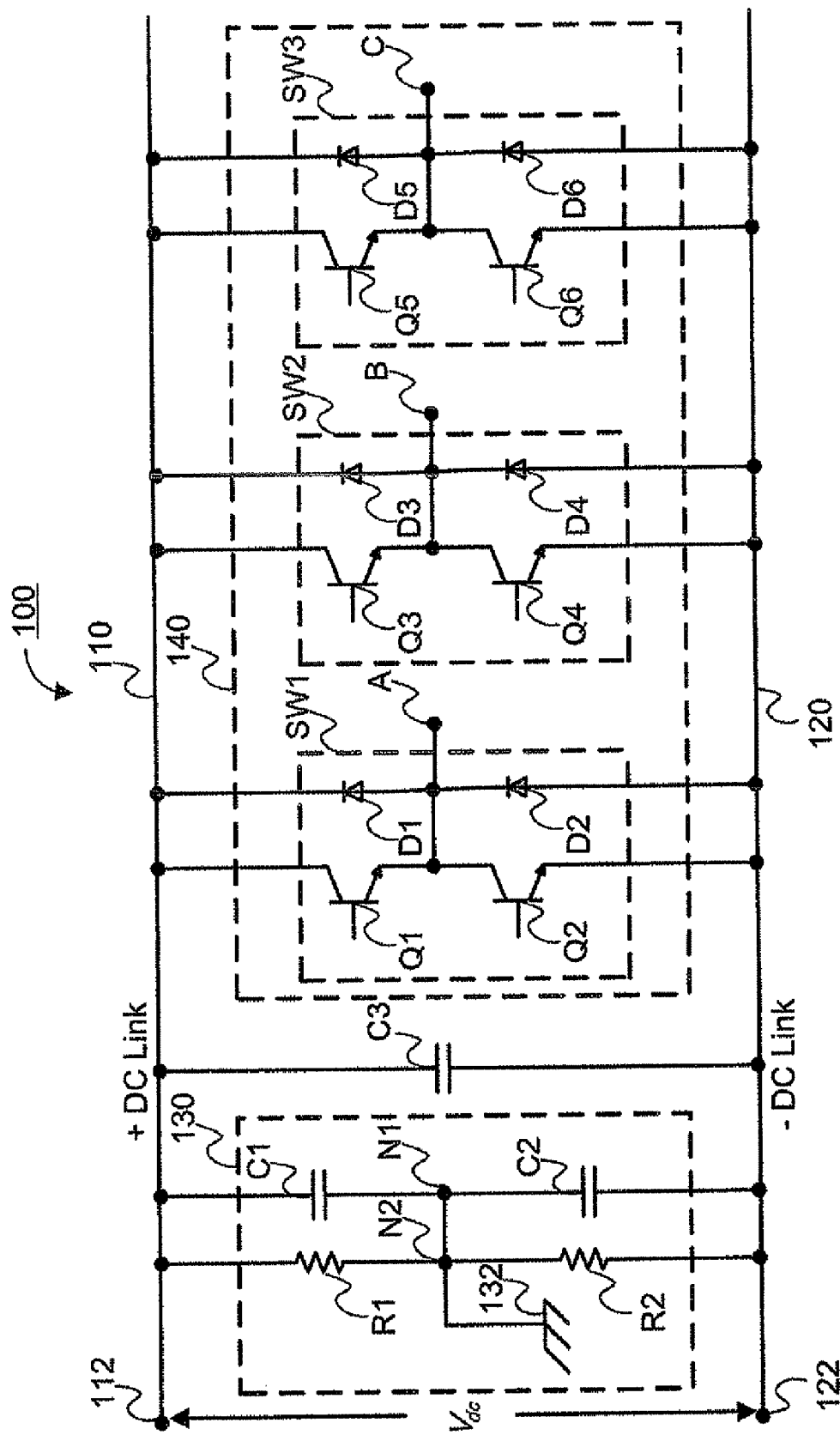
FIG. 1 depicts a schematic illustration of a conventional power stage of a DC/AC converter.
Figure 2:
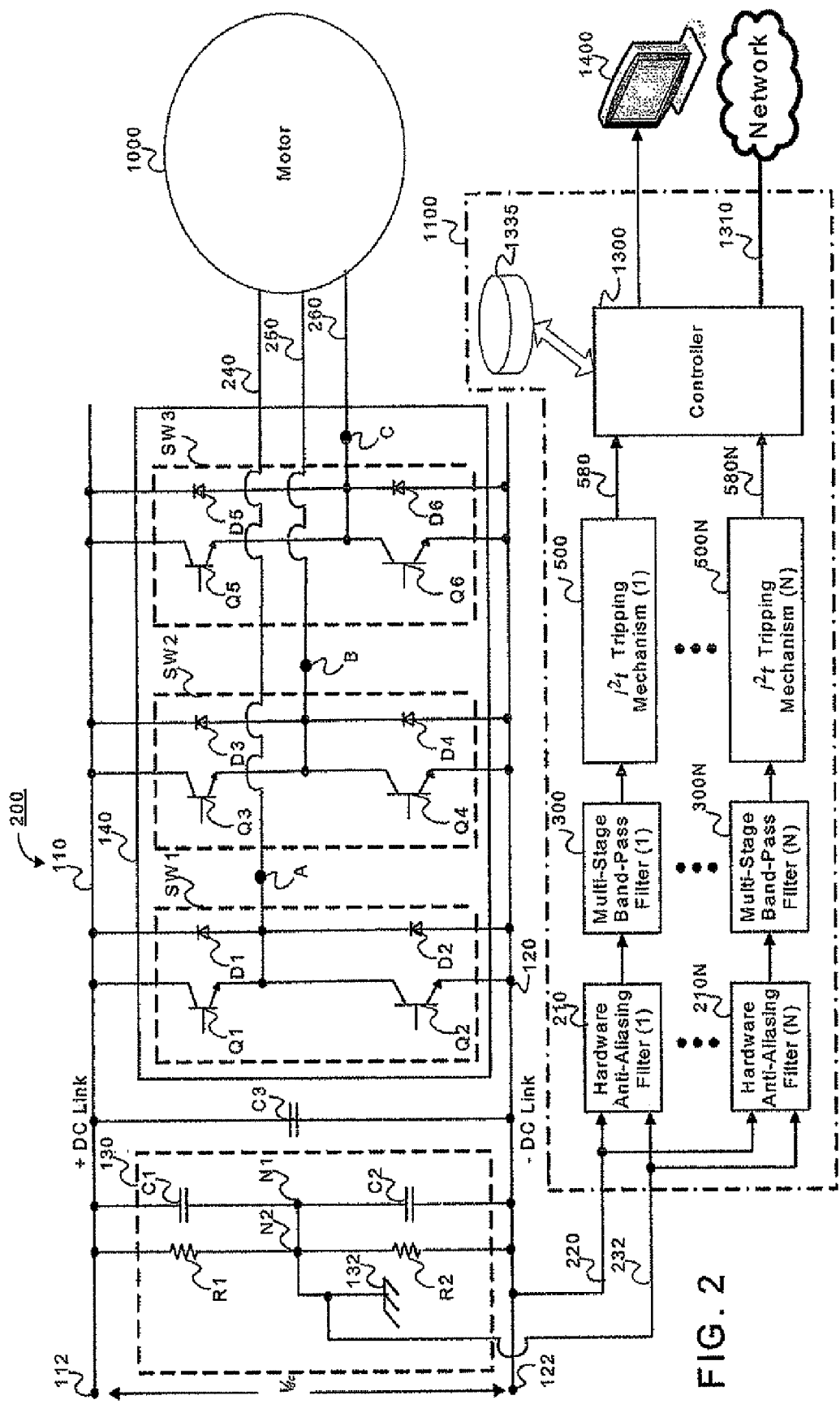
FIG. 2 depicts a schematic illustration of a power stage of the DC/AC converter shown in FIG. 1 employing an AC chassis fault detection mechanism according to one embodiment of the present invention.

FIG. 2 is a schematic illustration of a power stage of a DC/AC converter 200 with an AC chassis fault detection mechanism 1100 according to one embodiment of the present invention. As shown in FIG. 2, a motor 1000 is coupled to common terminals A, B, and C by way of leads 240, 250 and 260. Hardware anti-aliasing filter (1) 210 is shown coupled to receive the chassis voltage from between chassis ground 132 by way of lead 232 and either negative DC link 120 or positive DC link 110 (not shown). The output of the hardware anti-aliasing filter (1) 210 and hardware anti-aliasing filter (N) 210N are input into multi-stage band-pass filter (1) 300 and multi-stage band-pass filter (N) 300N which is output to $I^2t$ Tripping Mechanism (1) 500 and $I^2t$ Tripping Mechanism (N) 500(N). Additional hardware anti-aliasing filter N) 210N, multi-stage band-pass filter (N) 300N, and $I^2t$ Tripping Mechanism (N) 500N is also shown for illustrative purposes to show that AC chassis fault detection mechanism 1100 can respond to multiple switching frequencies outputted from other DC/AC converters that are coupled to DC Links 110 and 120 and also share the same chassis voltage from between chassis ground 132 and −DC link 120. In other words, the AC chassis fault detection mechanism 1100 is not limited to one hardware anti-aliasing filter, one multi-stage band-pass filter, and one $I^2t$ Tripping Mechanism, but can contain multiple numbers to monitor multiple DC/AC converters.

The output from $I^2t$ Tripping Mechanism (1) 500 and $I^2t$ Tripping Mechanism (N) 500(N) are input into Controller 1300 by way of leads 580 and 580N which compares various inputs to predetermined values stored in memory 1335 and displays status information on display 1400. Network port 1310 is also provided for allowing AC chassis fault detection monitoring over a network where multiple DC/AC converters in a hybrid electric vehicle can be monitored.

Figure 3:
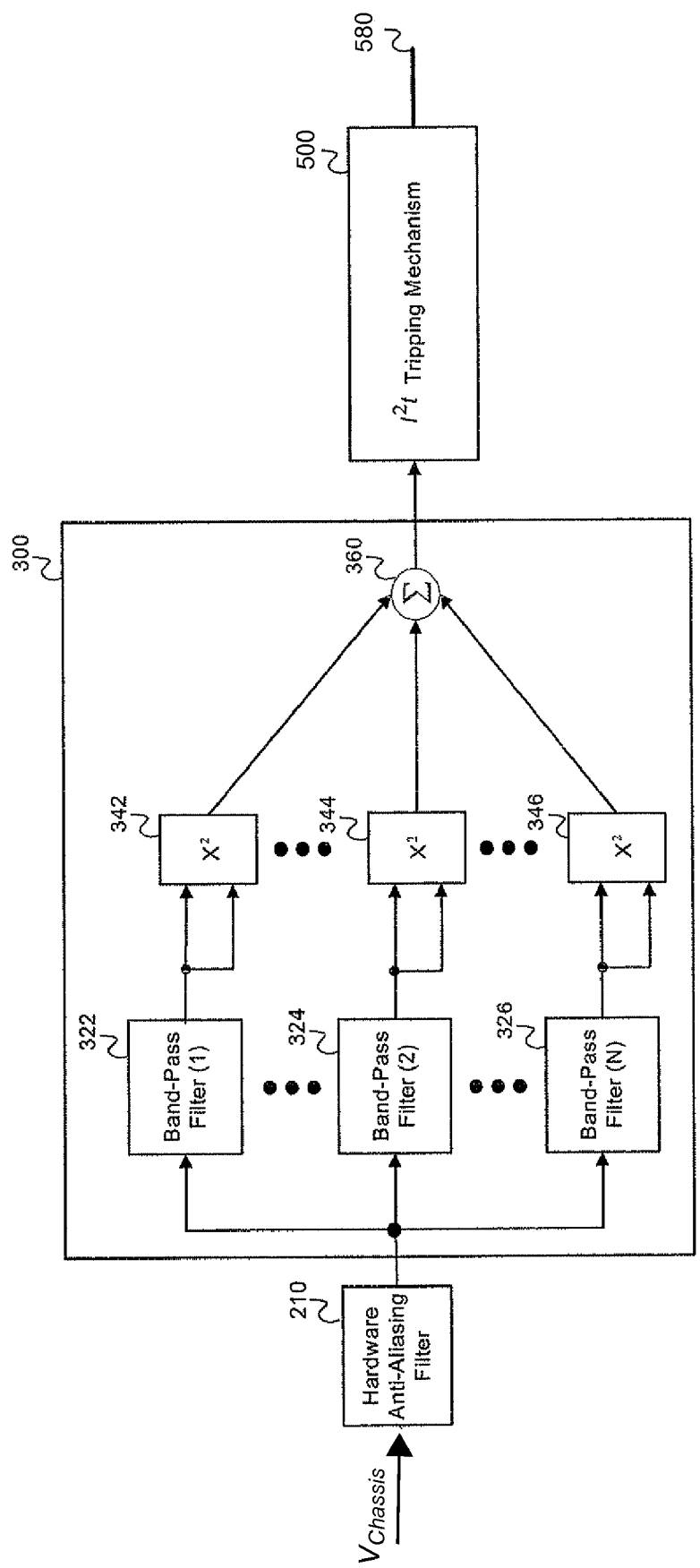
FIG. 3 depicts a schematic illustration of a Multi-stage Band-Pass filter including three band-pass filters each tuned to a first, second and third harmonic, respectively of the $V_{Chassis}$ signal, according to one embodiment of the present invention.

FIG. 3 is a schematic illustration of an example of a multi-stage band-pass filter 300 coupled to $I^2t$ Tripping Mechanism (1) 500 according to one embodiment of the present invention. As shown in FIG. 3, hardware anti-aliasing filter (1) 210 receives as an input $V_{Chassis}$ signal and outputs a filtered signal to multi-stage band-pass filter 300. FIG. 3 depicts a multi-stage band-pass filter including three band-pass filters; band-pass filter (1) 322, band-pass filter (2) 324, and band-pass filter (N) 326. Each band-pass filter is tuned to capture the sideband harmonics of the $V_{Chassis}$ signal, which is generated by PWM signals applied to the input of the power devices, appearing at each respective common terminal A, B, and C. It should be noted that a multi-stage band-pass filter 300 is merely one embodiment of the present invention. That is the present invention can include as little as one band-pass filter tuned to one sideband harmonic of the $V_{Chassis}$ signal or could include a multi-stage band-pass filter having more that three band-pass filter each tuned to a side-band harmonic of the $V_{Chassis}$ signal.

Figure 4:
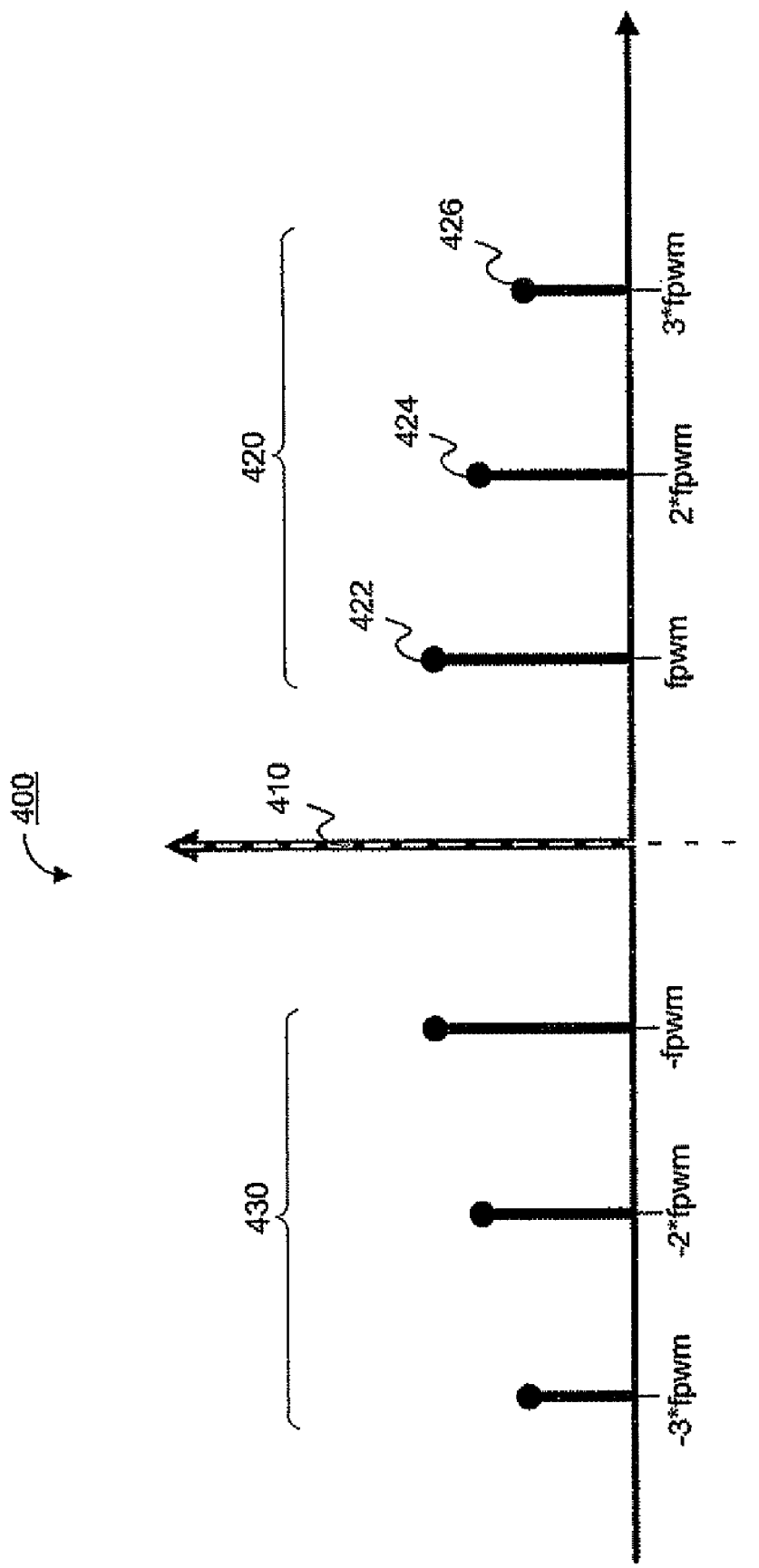
FIG. 4 depicts an example of the sideband harmonics of the $V_{Chassis}$ signal, according to one embodiment of the present invention.

FIG. 4 depicts an example of the sideband harmonics of the $V_{Chassis}$ signal 400, according to one embodiment of the present invention. As can be seen in FIG. 4, the magnitude of the $V_{Chassis}$ signal 410 shown with three positive side-band harmonics 420 and three negative side-band harmonics 430. The first side-band harmonic 422 is twice the switching frequency of the pulse width modulation signal (fpwm). The second side-band harmonic 424 represents three times the switching frequency of the pulse width modulation signal (2*fpwm) and the third harmonic shown is four times the switching frequency of the pulse width modulation signal (3*fpwm). The present invention is not limited to detection of the three harmonics shown in FIG. 4. Additional harmonics can be derived, however their usefulness as far as a detection trigger decreases due to the decrease in magnitude.

Referring back to FIG. 3, each band-pass filter; band-pass filter (1) 322, band-pass filter (2) 324, and band-pass filter (N) 326 is tuned to the first, second and third harmonic 422, 424, and 426 shown in FIG. 4. Hence, the output of each band-pass filter is the magnitude of the first, second and third harmonic 422, 424, and 426 shown in FIG. 4 and subjected to squaring functions $X^2$, 342, 344 and 346, respectively. As a result of squaring functions $X^2$; 342, 344 and 346, the energy of each harmonic is output and together summed at summer 360 which is the total energy squared.

Figure 5:
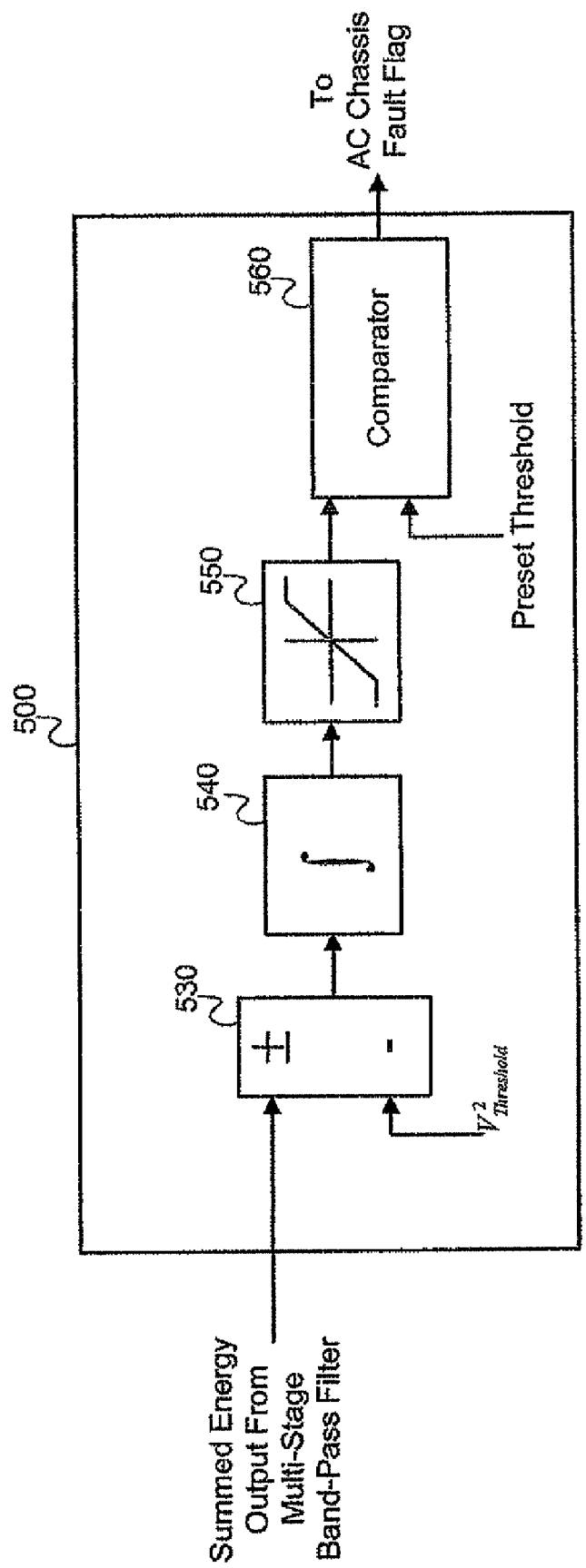
FIG. 5 depicts a schematic illustration of an $I^2t$ Tripping Mechanism according to one embodiment of the present invention.

The total summed energy squared is next propagated to the $I^2t$ tripping mechanism 500 shown in FIG. 5, according to one embodiment of the invention. As shown in FIG. 5, peak magnitude detector 530 senses the inputted total summed energy squared. Peak magnitude detector 530, subtracts the total summed energy squared from $V^2_{Threshold}$, which is a documented worst case scenario side-band harmonic during normal operation for each common terminal A, B, and C, when the system is fault free.

Figure 6:
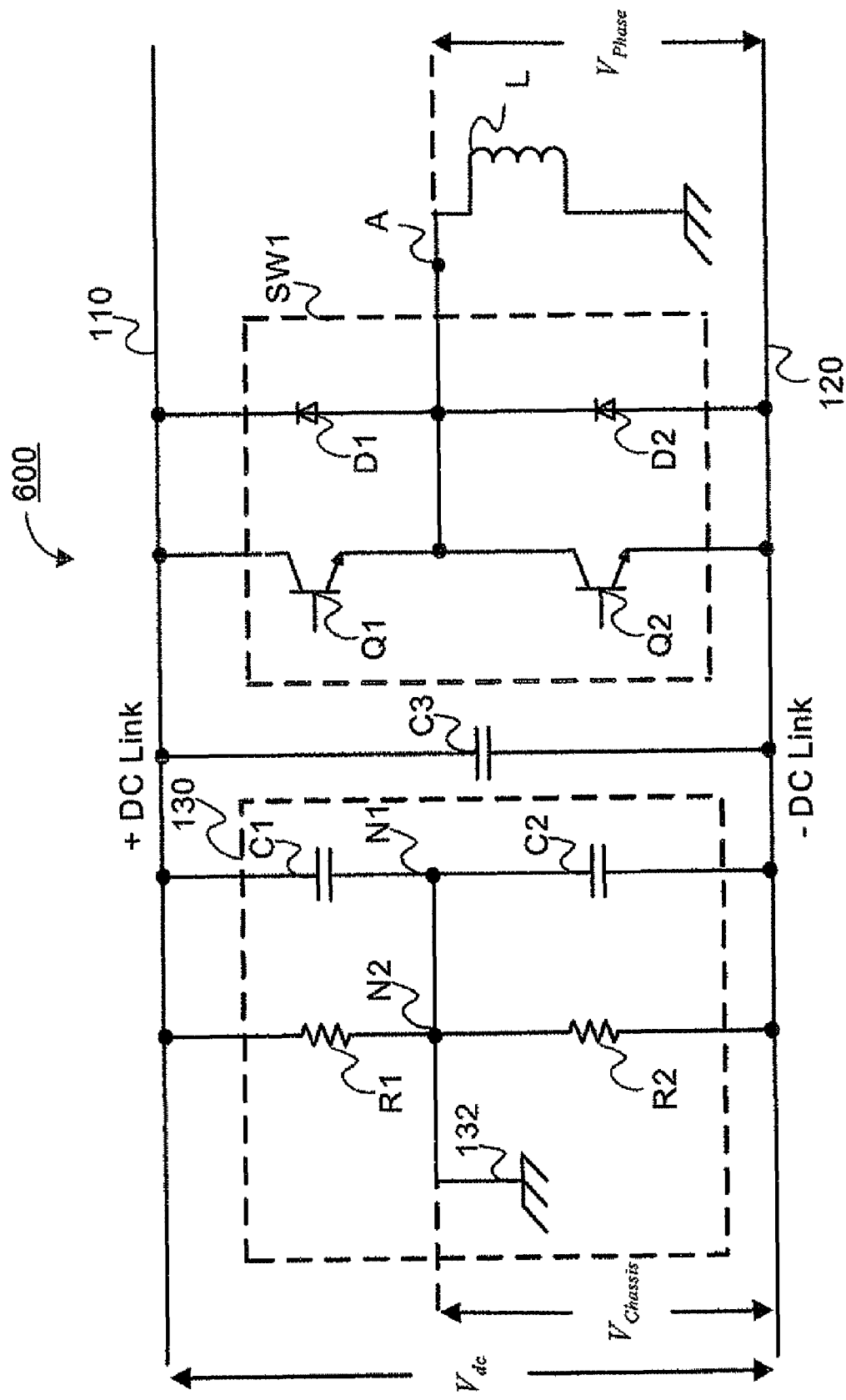
FIG. 6 depicts a schematic illustration of the transfer function of a power stage of a DC/AC converter showing phase voltage $V_{Phase}$, including a single AC chassis fault condition.

$V^2_{Threshold}$ takes into account the transfer function of a power stage of a DC/AC converter as shown in FIG. 6 which shows the phase voltage $V_{Phase}$ and a single AC chassis fault condition L. The transfer function of the DC/AC converter of the present invention has the characteristics of $$\frac{V_{Chassis}}{V_{Phase}}$$

which can be performed when the system has an AC chassis fault regardless of location where the transfer function characteristics of $$\frac{V_{Chassis}}{V_{Phase}} \text{ is } \frac{1}{[(2*C_{Snub}*L_{Short})*s^2 + (2*C_{Snub}*R_{Short})*s+1]},$$

and where s is the Laplace transform operator and $R_{Short}$ is the short-circuit resistance. $V_{Phase}$, shown in FIG. 6 is the voltage between common terminal A and negative DC link 120. The $L_{Short}$ can exhibit large or small impedance depending on the distance from the Common terminal. Moreover, $L_{Short}$ can exhibit stray capacitance due to the system. Hence, the transfer function provides the characteristics of common terminal A, B, or C regardless of the location of the AC fault condition.

From the transfer function, a fault condition value is calculated based upon a theoretical side band per unit value, a measured DC voltage $V_{dc}$ of said DC/AC converter (between +DC Line 110 and −DC Link 120) and a safety factor value and measured change in time Δt. The theoretical side band per unit value is the detected peak magnitude of a side band harmonic of $V_{Chassis}$. The actual value of the theoretical side band per unit value is derived from a PWM textbook such as *Switching and Linear Power Supply, Power Converter Design*, by Abraham Pressman McGraw-Hill (2nd Ed.) 1998. The safety factor value is the value calculated based upon the value of Snubber capacitors C1 and C2 and other system components in the DC/AC converter. The Δt is the scanning time which is inherent in the software or firmware employed.

Alternatively, using a frequency domain approach, the fault condition value is calculated to be equal to a sum of a harmonic voltage squared (i.e., summed energy output from band-pass filter 300 shown in FIG. 3) minus a threshold voltage squared multiplied by a change in time, Σ ($V_{Harmonic}^2 - V_{Threshold}^2$)*Δt, wherein Δt is the loop scan time of detection.

By squaring the transfer function a known normal operating threshold, $V^2_{Threshold}$ an energy quantity can be determined and subtracted from the total summed energy output from multi-stage band-pass filter 300 shown in FIG. 3 to obtain the system's actual excess energy. The present invention then integrates the actual excess energy in integrator 540 which is an error calculation of the energy times time. That is, the excess energy of the side-band harmonic outputted from detector 530 that exceeds the $V^2_{Threshold}$ is the triggering metric. The actual energy can be negative when $V^2_{Threshold}$ is greater than the summed energy output from the multistage band-pass filter, which could produce an anomalous result such as a "nuisance trip". To eliminate the negative energy outputted by integrator 540, the present invention employs an anti-windup limiter 550 which provides stability of the sensor data readings by eliminating this "nuisance trip". Optimally the anti-windup limiter is set to zero in one embodiment of the present invention so as to allow the transfer of positive excess energy and the blocking of negative excess energy. Then a comparator 560 compares the energy times time of a preset or predetermined threshold value and said integrated excess energy or peak magnitude value outputted from anti-windup limiter 550. If the peak magnitude value equals or exceeds the threshold value an AC chassis fault flag is triggered and the status is outputted from comparator 560 or the Controller 1300 shown in FIG. 2. Accordingly, the AC chassis fault flag can be implemented for example into a vehicle power management system (VPMS) or other computer program or system for trouble shooting an AC chassis fault in an electric vehicle or HEV.

The preset or predetermined threshold value can be one of many stored values that are determined by the maximum energy value times time that a component can be subjected to before failing. Thus this preset threshold value can be set to the weakest component in the system that one desires to protect.

In addition to the above system and method description of the present invention, the above-described $I^2t$ tripping mechanism can be implemented by a computer program through hardware or software to detect the identified system invariants including such hardware/software means as voltage measurements, anti-aliasing filtering, band-pass filtering, a peak/magnitude detector, and a comparator. Moreover, the present invention AC chassis fault detector allows for detection of AC faults among one or more DC/AC converters used in a system. In other words, the present invention can distinguish which DC/AC converter among several has an AC chassis fault by applying a different PWM switching frequency to different DC/AC converters. The present invention is also insensitive to the offset of chassis voltage measurement, since a sideband harmonic is an AC signal that is independent from the chassis voltage offset.

Therefore as set forth above, the present invention provides several advantages over the prior art such as providing a robust detection algorithm based upon an analytic analysis, which covers a wide-range of AC chassis fault conditions. Also the present invention provides a cost effective means of detecting AC fault conditions, wherein the provided hardware including voltage measurements and an anti-aliasing filter, a band-pass filter, peak/magnitude detector, and comparator can be replaced by software/firmware. Finally, the present invention has a fast and reliable tripping mechanism since the square of the magnitude of sideband harmonics is an energy quantity that allows for the $I^2t$ tripping mechanism to be applied.

As will be readily apparent to those skilled in the art, the present invention or aspects of the invention can be realized in hardware, or as some combination of hardware and software. Any kind of computer/server system(s)—or other apparatus adapted for carrying out the methods described herein—is suitable. A typical combination of hardware and software could be a general-purpose computer system with a computer program that, when loaded and executed, carries out methods described herein. Alternatively, a special purpose computer, containing specialized hardware for carrying out one or more of the functional tasks of the invention, could be utilized.

The present invention or aspects of the invention can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

What is claimed is:

1. A method of detecting an AC chassis fault on one or more DC/AC converters having a load, comprising: receiving a chassis voltage $V_{Chassis}$ signal from between a DC link voltage and a chassis ground; capturing at least one side band harmonic of said chassis voltage $V_{Chassis}$ signal; determining a peak magnitude value related to said side band harmonic (SBH); comparing said peak magnitude value to a predetermined threshold value, wherein if said peak magnitude value equals or exceeds said predetermined threshold value an AC chassis fault condition is detected on said one or more DC/AC converters having the load.

2. The method of claim 1, wherein the peak magnitude value is the maximum energy generated by the SBH minus the maximum energy generated by each said one or more DC/AC converters on a load operating under normal operating conditions without a fault over a predetermined amount of time.

3. The method of claim 1, further including coupling a filter to said DC link and the chassis ground that are shared among said one or more DC/AC converters.

4. The method of claim 1, wherein the step of determining a peak magnitude value, the further step of:
   calculating a fault condition value based upon a theoretical side band per unit value, a measured DC voltage $V_{dc}$ of each said one or more DC/AC converters, a safety factor value and measured change in time $\Delta t$.

5. The method of claim 4, further including the step of applying said calculated fault condition value to an anti-windup limiter, wherein the anti-windup limiter is set to zero.

6. The method of claim 1, wherein said peak magnitude value and a list of predetermined threshold values are stored.

7. The method of claim 1, wherein said determining step further comprises:
   a frequency domain approach to compute a value of a sum of a harmonic voltage squared minus a threshold voltage squared multiplied by a change in time $\Sigma(V_{Harmonic}^2 - V_{Threshold}^2)*\Delta t$, wherein $\Delta t$ is the loop scan time of detection.

8. The method of claim 1, wherein the comparing step determines which among each said DC/AC converter has an AC chassis fault condition.

9. An AC chassis fault detector for detecting an AC chassis fault on one or more DC/AC converters having a load, comprising: means for receiving a chassis voltage $V_{Chassis}$ signal from between a DC link voltage and a chassis ground; means for capturing at least one side band harmonic of said chassis voltage $V_{Chassis}$ signal; means for determining a peak magnitude value related to said side band harmonic (SBH); means for comparing said peak magnitude value to a predetermined threshold value, wherein if said peak magnitude value equals or exceeds said predetermined threshold value an AC chassis fault condition is detected on said one or more DC/AC converters having the load.

10. The apparatus of claim 9, wherein the peak magnitude value is the maximum energy generated by the SBH minus the maximum energy generated by each said one or more DC/AC converters on a load operating under normal operating conditions without a fault over a predetermined amount of time.

11. The apparatus of claim 9, wherein a band-pass filter captures a first side band harmonic of said chassis voltage $V_{Chassis}$ signal.

12. The apparatus of claim 9, wherein said determining means further comprises:
  means for calculating by a frequency domain approach a computed value of a sum of a harmonic voltage squared minus a threshold voltage squared multiplied by a change in time $\Sigma(V_{Harmonic}^2 - V_{Threshold}^2)*\Delta t$, wherein $\Delta t$ is the loop scan time of detection.

13. The apparatus of claim 12, further comprising an anti-windup limiter disposed between said means for calculating and said means for comparing, and the anti-windup limiter is set to zero.

14. The apparatus of claim 9, wherein said means for comparing can determine which among each said DC/AC converter has an AC chassis fault condition.

15. A program storage device readable by a machine, tangibly embodying a program of instructions executable by the machine to perform a method of detecting an AC chassis fault on one or more DC/AC converter having a load, comprising the steps of: receiving a chassis voltage $V_{Chassis}$ signal from between a DC link voltage and a chassis ground; capturing at least one side band harmonic of said chassis voltage $V_{Chassis}$ signal; determining a peak magnitude value related to said side band harmonic (SBH); comparing said peak magnitude value to a predetermined threshold value, wherein if said peak magnitude value equals or exceeds said predetermined threshold value an AC chassis fault condition is detected on said one or more DC/AC converters having the load.

* * * * *